(12) United States Patent
Lee

(10) Patent No.: US 11,789,816 B1
(45) Date of Patent: Oct. 17, 2023

(54) METHOD FOR CONTROLLING DATA STORAGE DEVICE STORING ASSOCIATED DATA IN TWO AREAS

(71) Applicant: NANYA TECHNOLOGY CORPORATION, New Taipei (TW)

(72) Inventor: Chun-Lu Lee, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/737,726

(22) Filed: May 5, 2022

(51) Int. Cl.
    G06F 11/10      (2006.01)
    G06F 11/07      (2006.01)
    H03K 19/20      (2006.01)
    G06F 3/06       (2006.01)

(52) U.S. Cl.
    CPC ........ G06F 11/1068 (2013.01); G06F 3/0619 (2013.01); G06F 3/0659 (2013.01); G06F 3/0679 (2013.01); G06F 11/0772 (2013.01); H03K 19/20 (2013.01)

(58) Field of Classification Search
    CPC ............. G06F 11/0772; G06F 11/1068; G06F 3/0619; G06F 3/0679; G06F 3/0659; G11C 29/42; G11C 29/52; G11C 29/82
    See application file for complete search history.

(56) References Cited

U.S. PATENT DOCUMENTS

| 10,379,949 B2* | 8/2019 | Televitckiy | ........... G06F 3/0644 |
| 2012/0215962 A1* | 8/2012 | Uhlaender | ............. G11C 29/82 |
| | | | 714/768 |

* cited by examiner

*Primary Examiner* — Shelly A Chase
(74) *Attorney, Agent, or Firm* — XUAN ZHANG

(57) ABSTRACT

The present disclosure provides a method for controlling a data storage device. The method includes: storing a first data in a first area of a memory of the data storage device; storing a second data in a second area of the memory, wherein the second data is associated with the first; reading the first data and the second data via a first communication interface; and in response to the read first data and second data, generating a first output signal.

19 Claims, 14 Drawing Sheets

METHOD FOR CONTROLLING DATA STORAGE DEVICE STORING ASSOCIATED DATA IN TWO AREAS

TECHNICAL FIELD

The present disclosure relates to a method for controlling a data storage device, and more particularly, to a method for controlling a data storage device storing associated data in at least two areas.

DISCUSSION OF THE BACKGROUND

Error correction code is widely used in data storage techniques to detect or correct data corruption. However, some controllers do not enable the ECC function until they receive data. Any data corruption occurring in the received data will impact the ECC function of the controllers.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of controlling a data storage device, comprising: storing a first data in a first area of a memory of the data storage device; storing a second data in a second area of the memory, wherein the second data is associated with the first data; reading the first data and the second data via a first communication interface; and in response to the read first data and second data, generating a first output signal.

Another aspect of the present disclosure provides a data storage device. The data storage device includes a first area and a second area. The first area is configured to store a first data. The second area is configured to store a second data. The second data is associated with the first data. The first data and/or the second data exclude an ECC.

Another aspect of the present disclosure provides a non-transitory computer readable medium storing a program including instructions that, when executed by a processor, cause a data storage device to: store a first data in a first area of the memory; store a second data in a second area of the memory, wherein the second data is associated with the first data; read the first data and the second data via a first communication interface; and in response to the read first data and second data, generate a first output signal.

The data storage device of the present disclosure includes a memory controller and a memory module. The memory module includes a first area and a second area. The first area and the second area are configured to store a first data and a second data, respectively. The first data is associated with the second data to form a data pair. The first data may be normal data and the second data may be encoded data. The memory controller is configured to read the first data and the second data via a communication interface and then generate an output signal based on the read first data and the second data. Generating the output signal includes performing a logic operation on the first data and the second data. When the output signal has a first value, it indicates that the first data and the second data are free from data corruption. When the output signal has a second value, it indicates that one of the first data and the second data has data corruption in its bit(s). Such a determination of the value of the output signal can be repeated on other data pairs. The data storage device of the present disclosure can detect whether the data pair is correct without using error correction code (ECC). This is beneficial for the memory controller, which has a passive ECC function, i.e., the ECC function is enabled after receiving data. Such a memory controller can still directly read the correct data from the memory module. The risk of wrongly triggering the ECC function of the memory controller with incorrect data can be diminished.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
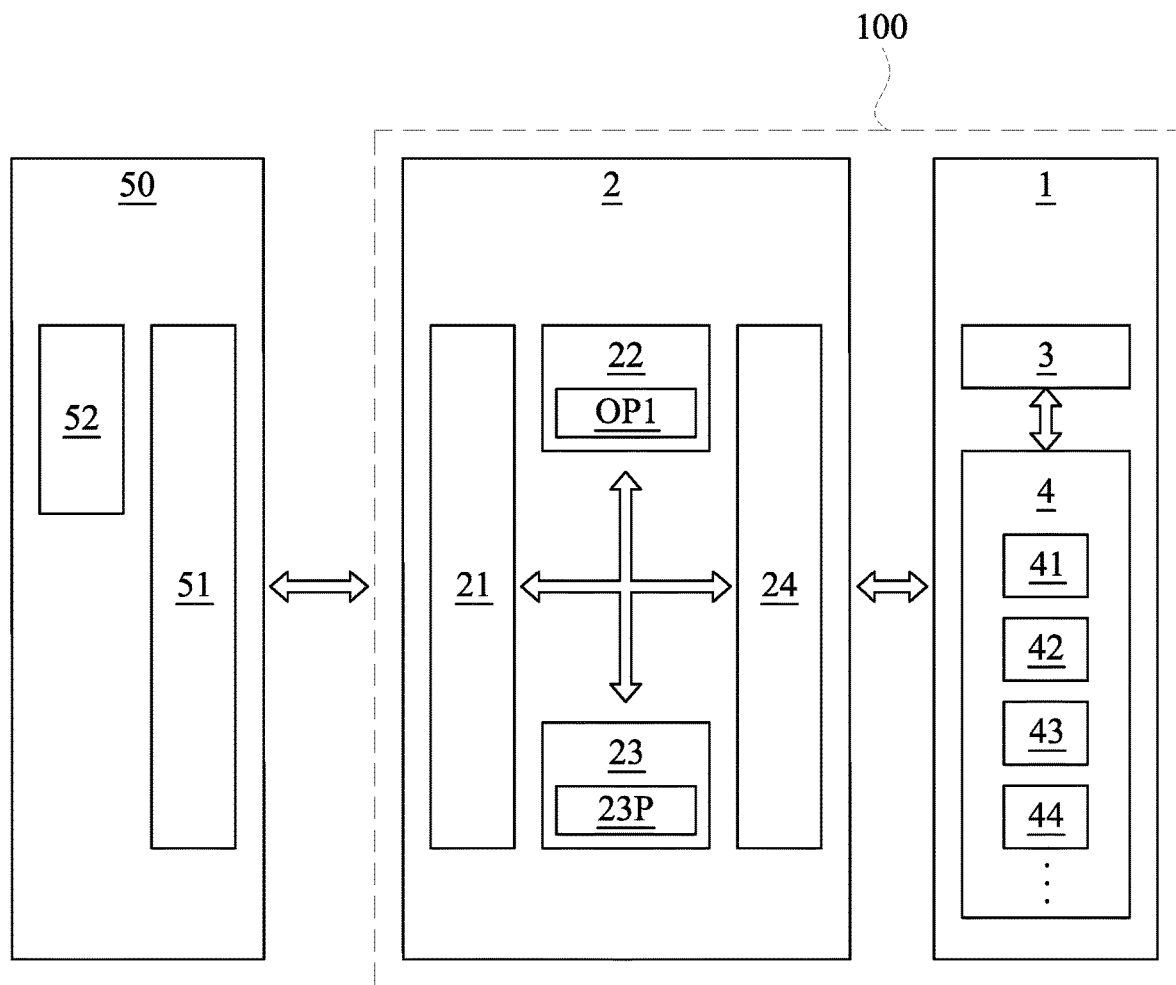
FIG. 1 illustrates a block diagram of a data storage device and a host device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a block diagram of a data storage device 100 and a host device 50 in accordance with some embodiments of the present disclosure. The data storage device 100 may include a portable or non-portable data storage device, for example, a memory card conforming to the SD/MMC, CF, MS, or XD standard, a non-volatile (NV) memory device, a flash memory device, or a solid state drive (SSD). The host device 50 may include a multifunctional mobile phone, a tablet, a wearable device, and a personal computer such as a desktop computer or a laptop. The data storage device 100 may be in communication with the host device 50 via a wire, a system bus, or wirelessly. Data may be transmitted between the data storage device 100 and the host device 50.

As shown in FIG. 1, the data storage device 100 may include a memory module 1 and a memory controller 2. The memory controller 2 may be in communication with the memory module 1 via a wire, a system bus, or wirelessly. The memory controller 2 may be configured to access the memory module 1. The memory module 1 may be configured to store data. The memory controller 2 may include an NV memory controller, a flash memory controller, or the like. The memory module 1 may include an NV memory module, a flash memory module, or the like. In some embodiments, the memory controller 2 of the data storage device 100 may include the function of a host device and thus the data storage device 100 may not be connected to a host device.

In some embodiments, the memory controller 2 may write system operation information into the memory module 1, e.g., a redundant array of independent disk (RAID) information, an error correction code (ECC) parity, a mapping table, a control flag, etc. The system operation information may be added in any step of writing the data, e.g., a data randomizing process or the like.

As shown in FIG. 1, the memory controller 2 may include a communication interface 21, a microprocessor 22 (or a processor), a memory 23, and a communication interface 24, wherein these components may be coupled to one another via a bus.

The host device 50 can indirectly access the memory module 1 in the data storage device 100 by sending a plurality of host device commands and corresponding logical addresses to the memory controller 2. The memory controller 2 may receive the plurality of host device commands and the logical address through the communication interface 21. The memory controller 2 may translate the plurality of host device commands into memory operation commands, and then control the memory module 1 to perform reading, writing/programming, or erasing on memory units or pages having a specific physical address within the memory module 1. The physical address may correspond to a logical address.

The communication interface 21 may receive or transmit one or more host device commands. The communication interface 21 may receive or transmit data, wherein the data may include one or more logical addresses, or pages of data. The communication interface 24 may receive or transmit one or more memory operation commands. The communication interface 24 may receive or transmit data, wherein the data may include one or more physical addresses, or pages of data. The communication interface 21 may be a bus protocol for communication from the host device 50, e.g., an integrated circuit therein, to the microcontroller 22, or the memory 23 of the memory controller 2. The communication interface 24 may be a bus protocol for communication from the memory controller 2 to the memory module 1. The communication interface 21 or communication interface 24 may conform to a specific communications specification (e.g., the serial advanced technology attachment (SATA) specification, the universal serial bus (USB) specification, the peripheral component interconnect express (PCIE) specification)) or to the non-volatile memory express (NVMe), and may perform communications based on this specific communications specification. The communication interface 21 may be an NVMe interface. The communication interface 24 may be a flash interface.

The microcontroller 22 of the memory controller 2 may have a functional block configured to perform a logic operation OP1 based on the read data from the memory module 1. The logic operation OP1 includes at least one of AND, NAND, OR, NOR, NOT, XOR, and XNOR.

The memory 23 may be configured to store information, such as a page of data, or a host device command from the host device 50. The memory 23 may be implemented with a random access memory (RAM). The memory 23 may be configured to store a program 23P which can be executed by the microprocessor 22.

The microprocessor 22 may be configured to execute a program 23P stored in the memory 23 to cause the data storage device 100 to perform a plurality of operations, such as reading, writing, or erasing. The program 23P may be stored in a non-transitory computer readable medium of the memory 23.

The memory module 1 may include a buffer memory 3, and a group of storage blocks 4, including storage blocks 41, 42, 44, wherein these components may be coupled to one another via a bus. In some embodiments, the group of storage blocks 4 may include more storage blocks. The buffer memory 3 may be communicated with the memory controller 2, e.g., the communication interface 24. The buffer memory 3 may be configured to store one or more memory operation commands from the memory controller 2. The buffer memory 3 may be configured to store data including physical addresses from the memory controller 2. The buffer memory 3 may be configured to store pages of data. The storage block group 4 may include, but are not limited to, a plurality of flash memory chips or dies. The storage blocks 41, 42, 43, 44 may include SLC, MLC, TLC, or QLC.

There are various techniques for manufacturing the memory module 1; for example, a 2D/planar NAND flash technology in which memory cells are arranged in a single layer, and a 3D NAND flash technology in which memory cells are arranged in multiple layers and vertically stacked. According to some embodiments, the memory module 1 can be implemented as a planar NAND flash architecture having a single layer of memory cells. According to some embodiments, the memory module 1 can be implemented as a 3D NAND flash architecture having memory cells stacked vertically in multiple layers.

Still referring to FIG. 1, the host device 50 may include a communication interface 51. The communication interface 51 may transmit one or more host device commands. The communication interface 51 may receive or transmit data, wherein the data may include one or more logical addresses, or pages of data. The communication interface 51 may conform to a specific communications specification (e.g., the serial advanced technology attachment (SATA) specification, the universal serial bus (USB) specification, the peripheral component interconnect express (PCIE) specification)) or to the non-volatile memory express (NVMe), and may perform communications according to this specific communications specification. The communication interface 51 may be an NVMe interface.

In some embodiments, the host device 50 may include a host memory 52, which may be a portion of an internal storage of the host device 50.

Figure 2:
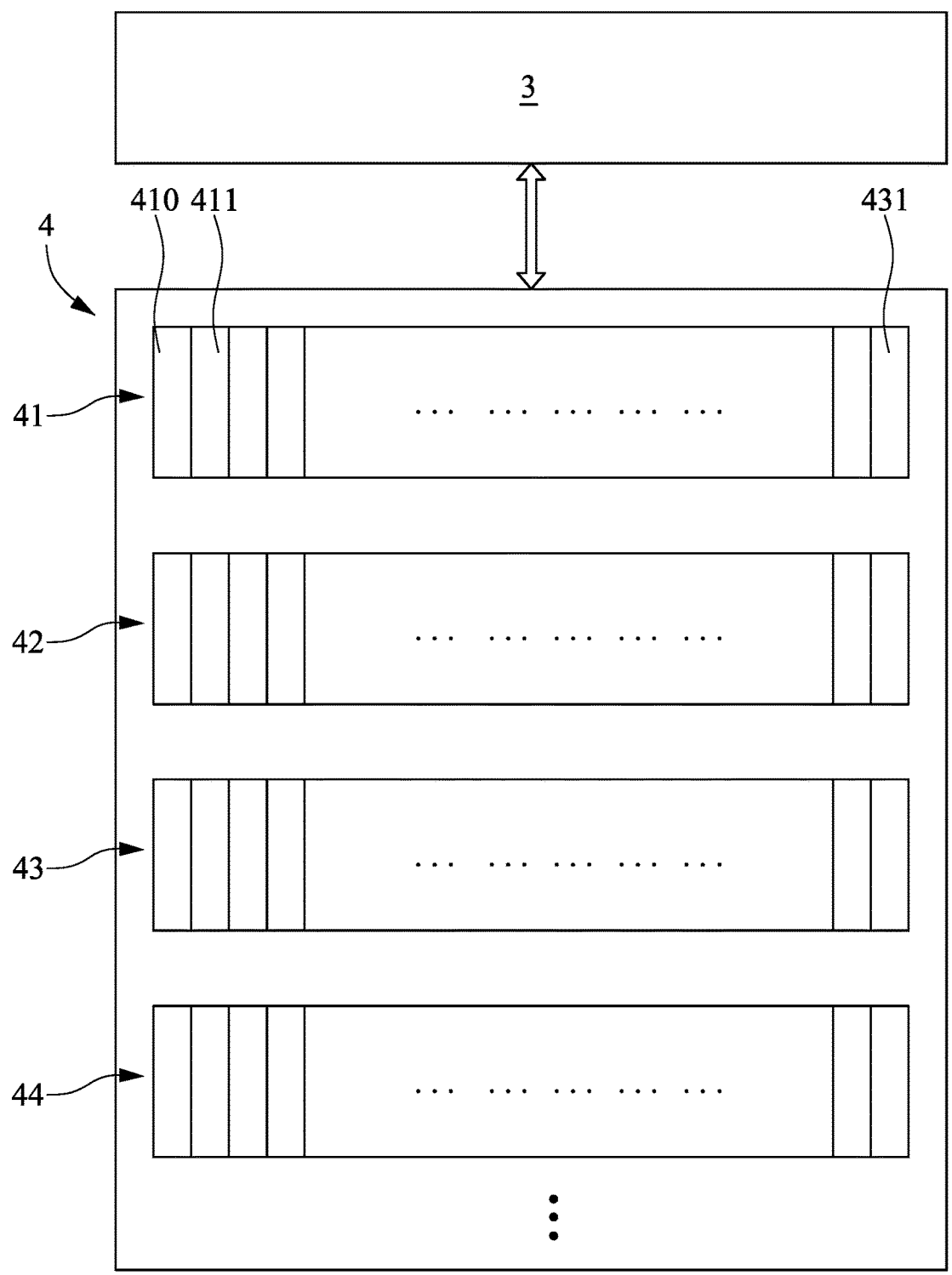
FIG. 2 illustrates a block diagram of a memory module of a data storage device in accordance with some embodiments of the present disclosure.

FIG. 2 illustrates a block diagram of the memory module 1 of the data storage device 100 in accordance with some embodiments of the present disclosure. Each of the blocks 41, 42, 43 and 44 includes a plurality of pages. As shown in FIG. 2, the blocks 41 includes pages 410, 411, . . . , 431. The number of the pages may be 32. In some embodiments, the number of the pages may be different, such as 64 or more. Each of the pages 410, 411, . . . , 431 may configured to store data.

The data stored in the pages 410, 411, . . . , 431 may be read through the communication interface 24 in response to address signals, data signals, or command signals from the memory controller 2. The data stored in the pages 410, 411, . . . , 431 may be stored in the buffer memory 3.

Figure 3:
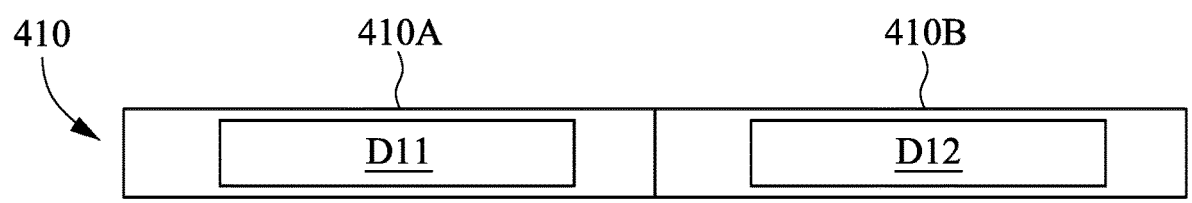
FIG. 3 illustrates a block diagram of a page of a memory module of a data storage device in accordance with some embodiments of the present disclosure.

FIG. 3 illustrates a block diagram of the page 410 of the block 41 of the memory module 1 in accordance with some embodiments of the present disclosure. As shown in FIG. 3, the page 410 may include a first area 410A and a second area 410B. In other words, the first area 410A and the second area 410B are on the same page (e.g., the page 410) of the memory module 1. The first area 410A may be configured to store a first data D11. The second area 410B may be configured to store a second data D12. The second data D12 may be associated with the first data D11 to form a data pair. The first data D11 and/or the second data D12 may exclude an ECC. In some embodiments, the first data D11 is encoded to be the second data D12. In such case, the first data D11 may be considered as normal data and the second data D12 may be considered encoded data. In some embodiments, the second data D12 is complementary to the first data D11. In some embodiments, the first data D11 and the second data D12 are the same.

Figure 4:
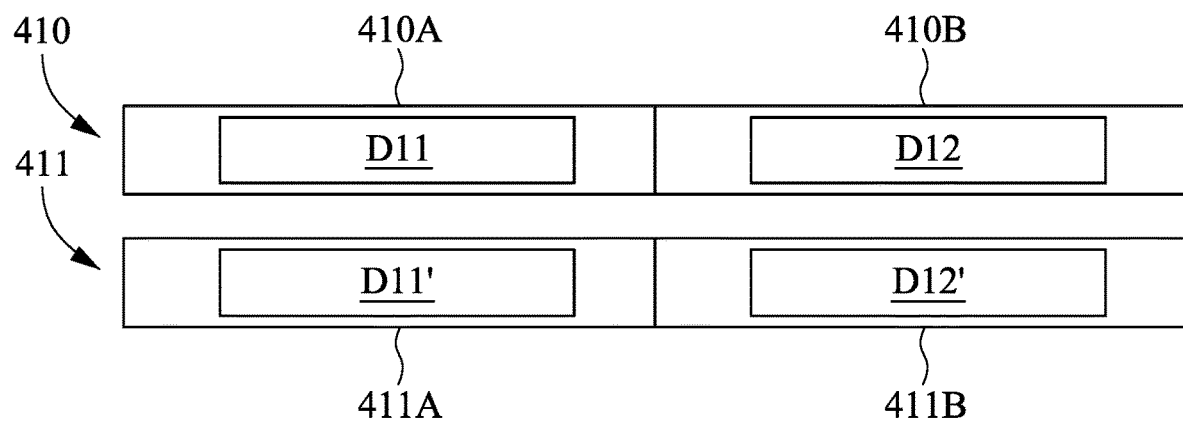
FIG. 4 illustrates a block diagram of a plurality of pages of a memory module of a data storage device in accordance with some embodiments of the present disclosure.

FIG. 4 illustrates a block diagram of a plurality of pages 410 and 411 of the memory module 41 of the data storage device 100 in accordance with some embodiments of the present disclosure. The detailed descriptions regarding page 410 can refer to the embodiments as illustrated in FIG. 3. As shown in FIG. 4, the page 411 may include a third area 411A and a fourth area 411B. In other words, the third area 411A and the fourth area 411B are on the same page (e.g., the page 411) of the memory module 1. The third area 411A may be configured to store a third data D11'. The fourth area 411B may be configured to store a fourth data D12'. The fourth data D12' may be associated with the third data D11' to form a data pair. The third data D11' and/or the fourth data D12' may exclude an ECC. In some embodiments, the third data D11' is encoded to be the fourth data D12'. In such case, the third data D11' may be considered as normal data and the fourth data D12' may be considered encoded data. In some embodiments, the fourth data D12' is complementary to the third data D11'. In some embodiments, the third data D11' and the fourth data D12' are the same.

The first data D11 and the third data D11' may correspond to the same original data. The third data D11' may correspond to the first data D11. The first data D11 and the third data D11' may be different if data corruption occurs during the write operation of the first data D11 and/or the third data D11'. If no data corruption occurs, the first data D11 and the third data D11' are the same. The second data D12 and the fourth data D12' may correspond to the same original data. The second data D12 and the fourth data D12' may be different if data corruption occurs during the write operation of the second data D12 and the fourth data D12'. If no data corruption occurs, the second data D12 and the fourth data D12' are the same.

Furthermore, there may be more pages in the storage block 41 including two areas configured to store two pieces of data associated with each other.

Figure 5:
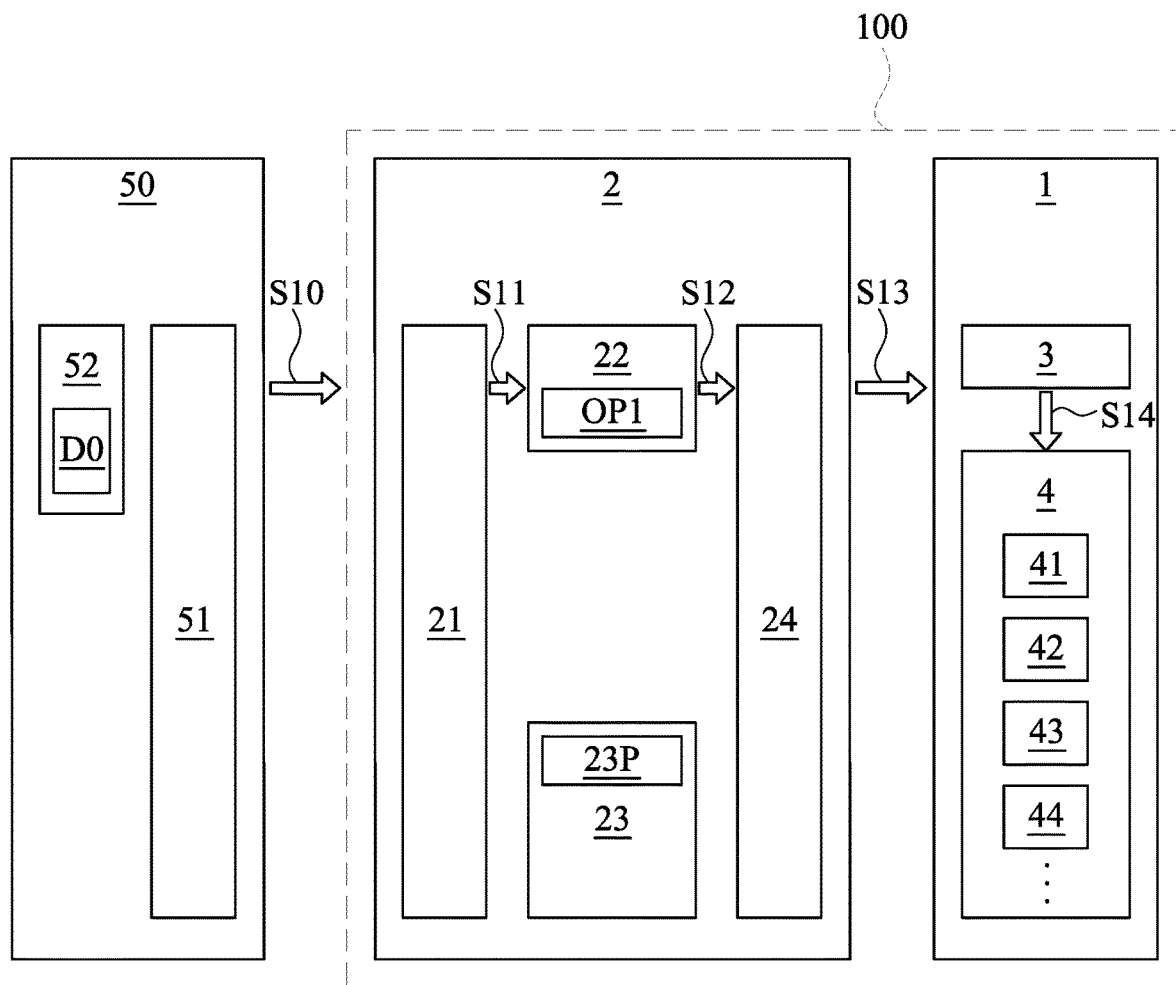
FIG. 5 is a schematic diagram illustrating a write sequence in a data storage device and a host device according to some embodiments of the present invention.

FIG. 5 is a schematic diagram illustrating a write sequence in a data storage device (e.g., the data storage device 100) and a host device (e.g., the host device 50) according to some embodiments of the present invention. The operations disclosed in the embodiments of FIG. 3 as discussed in the following paragraphs/sections may be controlled by the microprocessor 22 when it executes the program 23P stored in the memory 23.

As shown in FIG. 5, the host device 50 may transmit data or host device commands to the data storage device 100 (S10). The communication interface 21 of the data storage device 100 may be configured to receive data or host device commands from the host device 50 (S10). The communication interface 21 may be configured to receive original data DO from the host device 50. The original data DO may include a page of data. In alternative embodiments, the original data DO may include a plurality of data pages. The communication interface 21 may be configured to transmit the original data DO to the microprocessor 22 (S11). The microprocessor 22 may be configured to receive the original data DO (S11). After being received by the microprocessor 22 of the memory controller 2, the original data DO may be programmed to be the first data D1 to conform to a specific communications specification used in the communication interface 24.

In some embodiments, the original data DO and the first data D1 are the same. In some embodiments, the microprocessor 22 of the memory controller 2 may be configured to encode the original data DO into the second data D12. The second data D12 may be complementary to the original data DO. In some embodiments, the memory controller may not enable an ECC function, such that the first data and/or the second data may exclude an ECC. The microprocessor 22 of the memory controller 2 may be configured to transmit the first data D11 and the second data D12 to the communication interface 24 (S12). The communication interface 24 may be configured to transmit the first data D11 and the second data D12 along with address signals and write commands to the memory module 1, e.g., the buffer memory 3 (S13). The buffer memory 3 may be configured to buffer the first data D11 and the second data D12. The buffer memory 3 may be configured to transmit the first data D11 to the first area 410A of the page 410 in the block 41 as illustrated in FIGS. 3 and 4, in response to the address signals and the write commands (S14). Similarly, the buffer memory 3 may be configured to transmit the second data D12 to the second area 410B of the page 410 in the block 41 in response to the address signals and the write commands (S14).

Furthermore, the microprocessor 23 may be configured to duplicate the first data D11 and the second data D12 into the third data D11' and the fourth data D12', respectively. The microprocessor 23 may be configured to transmit the third data D11' and the fourth data D12' along with address signals and write commands to the communication interface 24 (S12), which in turn transmits these data and address signals and write commands into the memory module 2 (S13). The buffer memory 3 may be configured to transmit the third data D11' to the third area 411A of the page 411 in the block 41 as illustrated in FIGS. 3 and 4, in response to the address signals and the write commands (S14). Similarly, the buffer memory 3 may be configured to transmit the second data D12 to the fourth area 411B of the page 411 in the block 41 in response to the address signals and the write commands (S14). In some embodiments, the microprocessor 22 of the memory controller 2 may be configured to repeat the transmission of the original data with an updated specific communications specification and the encoded data to different pages (e.g., the first data D11 and the second data D12 in the page 410, the third data D11' and the fourth data D12' in the page 411) of the same storage block (e.g., the storage block 41).

The write sequence as illustrated in FIG. 5 can be repeated until all of the original data DO are written. Therefore, it may require a plurality of pages to store the original data DO with the operations as illustrated in FIG. 5. Therefore, the data storage device may store the original data DO in a space twice as large as that of conventional techniques.

In an alternative embodiment, the first data D11, the second data D12, the third data D11', and/or the fourth data D12' may be programmed into the memory module 2 by an electronic device, such as a programmer, device programmer, chip programmer, or NAND programmer.

Figure 6:
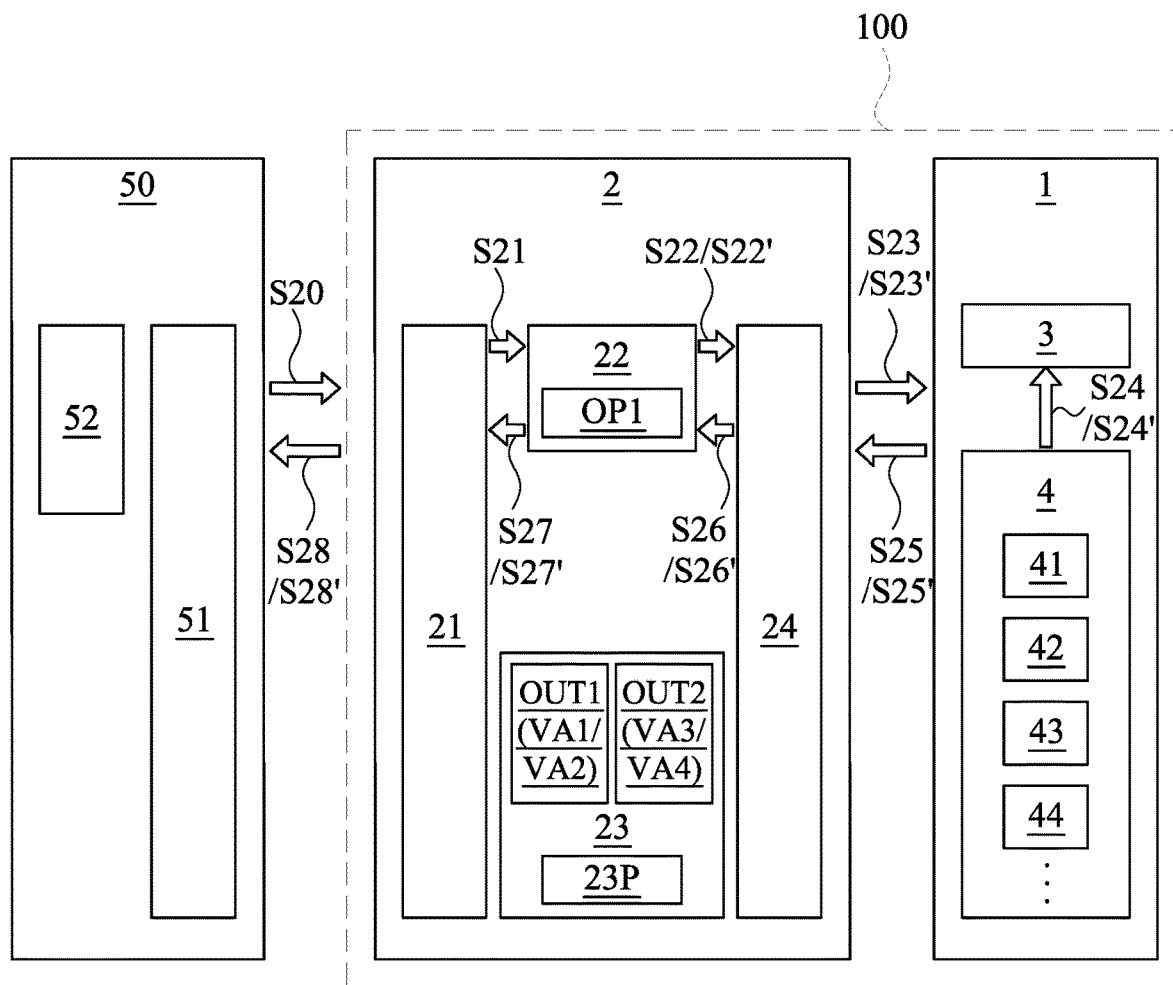
FIG. 6 is a schematic diagram illustrating a read sequence in a data storage device and a host device according to some embodiments of the present invention.

FIG. 6 is a schematic diagram illustrating a read sequence in a data storage device (e.g., the data storage device 100) and a host device (e.g., the host device 50) according to some embodiments of the present invention. The operations disclosed in the embodiments of FIG. 3 as discussed in the following paragraphs/sections may be controlled by the microprocessor 22 when it executes the program 23P stored in the memory 23.

As shown in FIG. 6, the host device 50 may be configured to transmit host device commands to the communication interface 21 of the data storage device 100 (S20). The host device commands may cause the data storage device 100 to provide the stored data associated with the original data DO. The communication interface 21 may be configured to transmit the host device commands to the microprocessor 22 (S21). The microprocessor 22 may be configured to process the host device commands and further generate address signals and read commands for read the data stored in the memory module 1 associated with the original data DO. In some embodiments, the first data D11 and the second data D12 stored in the page 410 in the block 41 of the memory module 2 are associated with the original data DO. The microprocessor 22 may be configured to transmit the address signals and read commands to the communication interface 24 (S22). The communication interface 24 may be configured to transmit the address signals and read commands to the memory module 1, e.g., the buffer memory 3 (S23).

The buffer memory 3 may be configured to read the first data D11 from the first area 410A of the page 410 and the second data D12 from the second area 410B of the page 410 (S24). The buffer memory 3 may be configured to buffer the first data D11 and the second data D12. The buffer memory 3 may be configured to transmit the first data D11 and the second data D12 to the communication interface 24 (S25). The communication interface 24 may be configured to transmit the first data D11 and the second data D12 to the microprocessor 22 (S26). In other words, the memory controller 2 may be configured to read the first data D11 and the second data D12 through the communication interface 24, in response to the address signals and the read commands. The memory controller 2 may be configured to generate a first output signal OUT1 in response to the first data D11 and the second data D12. The first output signal OUT1 may be stored in the memory 23. The microcontroller 22 of the memory controller 2 may have a functional block for generating the first output signal OUT1. The functional block of the microcontroller 22 may be configured to perform a logic operation OP1 based on data pairs (e.g., the first data D11 and the second data D12). The logic operation OP1 includes at least one of AND, NAND, OR, NOR, NOT, XOR, and XNOR.

In some embodiments, the first data D11 and the second data D12 may be complementary. For example, when the first data D11 is 55 in hexadecimal, the second data D12 is AA in hexadecimal. In another example, when the first data D11 is 88 in hexadecimal, the second data D12 is 77 in hexadecimal. Yet in another example, when the first data D11 is 01010101 in Binary, the second data D12 is 10101010 in Binary. The microcontroller 22 of the memory controller 2 may be configured to perform an XOR operation OP1 on the first data D11 and the second data D12. The microcontroller 22 of the memory controller 2 may be configured to generate the first output signal OUT1 having a first value VA1, e.g., FF in hexadecimal when the first data D11 and the second data D12 are complementary. The first value VA1 indicates that the bits in the page 410 as illustrated in FIG. 3, which store the first data D11 and the second data D12, are free from data corruption (i.e., no incorrect bits). As such, the memory controller 2 may be configured to transmit the first data D11 to the communication interface 21 (S27). The communication interface 21 may be configured to transmit the first data D11 to the host device 50 (S28). In other words, the memory controller is configured to transmit the first data D1 to the host device 50 through the communication interface 22 when the first output signal OUT1 has the first value VA1. In some embodiments, the first data D11 and/or the second data D12 may have incorrect bits or have data corruption. As such, the microcontroller 22 of the memory controller 2 may be configured to generate the first output signal OUT1 having a second value VA2 different from the first value VA1.

When the first output signal OUT1 has the second value VA2, the memory controller 2 may be further configured to transmit address signals and read commands to the communication interface 24 (S22'). The communication interface 24 may be configured to transmit the address signals and read commands to the memory module 1 (S23'). The buffer may be configured to read the third data D11' and the fourth data D12' in response to the address signals and read commands (S24'). The buffer memory 3 may be configured to buffer the third data D11' and the fourth data D12'. The buffer memory 3 may be configured to transmit the third data D11' and the fourth data D12' to the communication interface 24 (S25'). The communication interface 24 may be configured to transmit the third data D11' and the fourth data D12' to the microprocessor 22 (S26'). In other words, the memory controller 2 may be configured to read the third data D11' and the fourth data D12' through the communication interface 24, in response to address signals and read commands from the memory controller 2. The memory controller 2 may be configured to generate a second output signal OUT2 in response to the third data D11' and the fourth data D12'. The second output signal OUT2 may be stored in the memory 23 of the memory controller 2.

In some embodiments, the third data D11' and the fourth data D12' may be complementary. The microcontroller 22 of the memory controller 2 may be configured to perform an XOR operation on the third data D11' and the fourth data D12'. The microcontroller 22 of the memory controller 2 may be configured to generate the second output signal OUT2 having a third value VA3 when the third data D11' and the fourth data D12' are complementary. The third value VA3 indicates that the bits in the page 411 as illustrated in FIG. 3, which store the third data D11' and the fourth data D12', are free from data corruption (e.g., no incorrect bits). As such, the memory controller 2 may be configured to transmit the third data D11' to the communication interface 21 (S27'). The communication interface 21 may be configured to transmit the third data D11' to the host device 50 (S28'). In other words, the memory controller 2 may be configured to transmit the third data D11' to the host device 50 through the communication interface 22 when the second output signal OUT2 has the third value VA3. In some embodiments, the third data D11' and/or the fourth data D12' may have incorrect bits or have data corruption. As such, the microcontroller 22 of the memory controller 2 may be configured to generate the second output signal OUT2 having a fourth value VA4 different from the third value VA3.

When the second output signal OUT2 has the fourth value VA4, the memory controller 2 may be further configured to read the further data (or further data pairs) stored in further areas of the memory module 2 through the communication interface 24 in response to address signals and/or command signals from the memory controller 2. The further data may be associated with the original data DO. The further data may correspond to the first data D11 and the second data D12. In other words, one of the further data and the first data D11 may correspond to the same original data. The memory controller 2 may be further configured to generate further output signals based on the further data. The memory controller 2 may be configured to determine whether the stored further data have data corruption based on the further output signals. The memory controller 2 may be configured to transmit one of the further data to the host device 50 through the communication interface 24 when the further data is determined to have no data corruption. In some embodiments, the memory controller 2 may be configured to read more further data stored in the communication interface 24 until the memory controller 2 reads the correct data.

In some comparative embodiments, memory controllers may have a passive ECC function, which means that the memory controllers enable the ECC function after they read the data stored in a memory module. It is necessary that the firstly read data excludes any incorrect bits or data corruption. Otherwise, the ECC function of the memory controllers may not be enabled or may work incorrectly. As such, requirements for the reliability of the memory units which store the supposed-firstly-read data are extremely strict. Such memory units must be free from any defects, which is almost impossible for the manufacturing industry to guarantee. In the present disclosure, the memory controller 2 may store the data pair (e.g., the first data D11 and the second data D12), which is associated with the original data DO, in different areas of the same page. In response to the host device commands for reading the data stored in the memory module 2 that is associated with/corresponds to the original data DO, the memory controller 2 may be configured to read at least one data pair. The memory controller 2 may be configured to determine whether the bits storing the data-pair have no data corruption. Based on the determination, the memory controller 2 may be configured to transmit the normal data of the data pair to the host device (e.g., the host device 50) or to read a further data pair that is associated with/corresponds to the original data DO. Such a determination can be repeated until the data pair having no data corruption is found. As such, the data storage device 100 may still be able to directly read the correct data without ECC function. The risk of incorrectly triggering the ECC function of the memory controller 2 with incorrect data can be diminished.

In some embodiments, the microprocessor 22 of the memory controller 2 may be configured to perform ADD operation when the first data D1 and the second data D2 are supposed to be the same, and when no data corruption occurs. Based on the type of the data pair (e.g., the first data D1 and the second data D2), the microprocessor 22 of the memory controller 2 may be configured to perform a logical operation to determine whether the data pair has data corruption.

Figure 7:
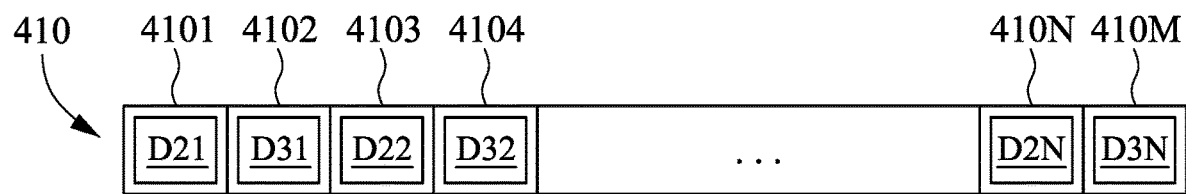
FIG. 7 illustrates a block diagram of a page of a memory module of a data storage device in accordance with some embodiments of the present disclosure.

FIG. 7 illustrates a block diagram of the page 410 of the memory module 1 of the data storage device 100 in accordance with some embodiments of the present disclosure. As shown in FIG. 7, the page 410 includes a first plurality of sub-areas 4101, 4103, . . . , 410N. The page 410 includes a second plurality of sub-areas 4102, 4114, . . . , 410M. The first plurality of sub-areas 4101, 4103, . . . , 410N and the second plurality of sub-areas 4102, 4114, . . . , 410M are interleaved with each other.

The first plurality of sub-areas 4101, 4103, . . . , 410N may include a first plurality of data D21, D22, . . . , D2N (e.g., the normal data). The second plurality of sub-areas 4102, 4104, . . . , 410N may include a second plurality of data D31, D32, . . . , D3N (e.g., the encoded data). Each of the first plurality of data D21, D22, . . . , D2N may be associated with the corresponding one of the second plurality of data D31, D32, . . . , D3N. For example, the data D21 may be associated with the data D31. The data D31 is complementary with the data D21. The data storage device 100 can read the correct data from the data pair of the normal data D21, D22, . . . , D2N and the encoded data D31, D32, . . . , D3N through the operations as illustrated in FIGS. 5 and 6.

Figure 8:
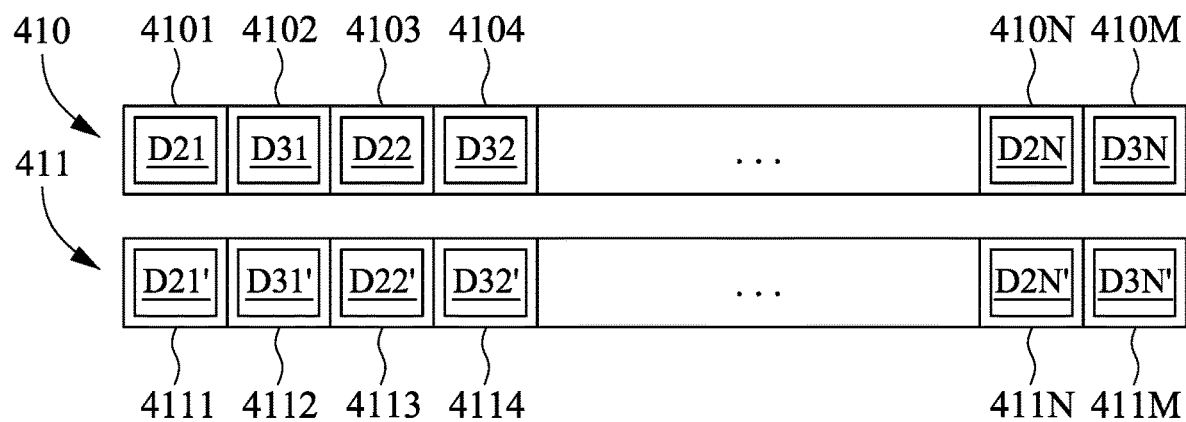
FIG. 8 illustrates a block diagram of a plurality of pages of a memory module of a data storage device in accordance with some embodiments of the present disclosure.

FIG. 8 illustrates a block diagram of the pages 410 and 411 of the memory module 1 of the data storage device 100 in accordance with some embodiments of the present disclosure. The detailed descriptions of page 410 can refer to the embodiments as illustrated in FIG. 7. As shown in FIG. 7, the page 411 includes a third plurality of sub-areas 4111, 4113, . . . , 410N. The page 411 includes a fourth plurality of sub-areas 4112, 4114, . . . , 411M. The third plurality of sub-areas 4111, 4113, . . . , 411N and the fourth plurality of sub-areas 4112, 4114, . . . , 411M are interleaved with each other.

The third plurality of sub-areas 4111, 4113, . . . , 410N may include a third plurality of data D21', D22', . . . , D2N' (e.g., the normal data). The fourth plurality of sub-areas 4112, 4114, . . . , 411M may include a fourth plurality of data D31', D32', . . . , D3N' (e.g., the encoded data). Each of the third plurality of data D21', D22', . . . , D2N' may be associated with the corresponding one of the fourth plurality of data D31', D32', . . . , D3N'. For example, the data D21' may be associated with the data D31'. The data D31' is complementary with the data D21'. The data storage device 100 can read the correct data from the data-pair of the normal data D21, D22, . . . , D2N and the encoded data D31, D32, . . . , D3N and of normal data D21', D22', . . . , D2N' and the encoded data D31', D32', . . . , D3N' through the operations as illustrated in FIGS. 5 and 6.

Furthermore, there may be more pages in the storage block 41 including two pluralities of sub-areas configured to store two pluralities of data associated with each other.

Figure 9:
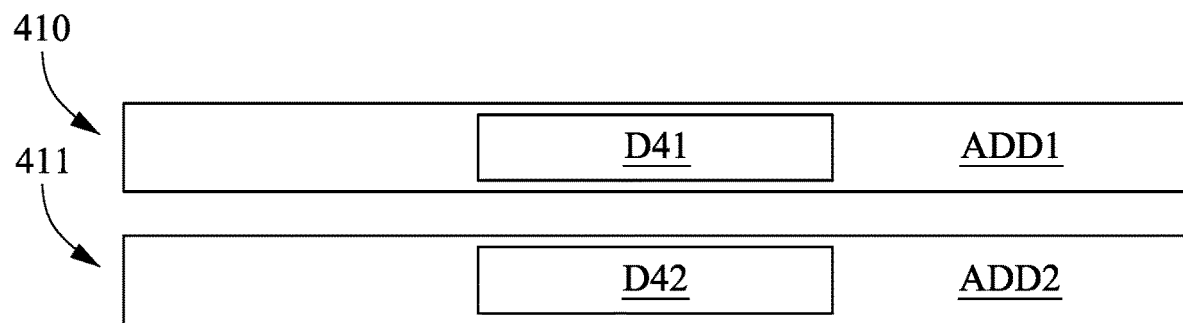
FIG. 9 illustrates a block diagram of a plurality of pages of a memory module of a data storage device in accordance with some embodiments of the present disclosure.

FIG. 9 illustrates a block diagram of the plurality of pages 410 and 411 of the memory module 2 of the data storage device 100 in accordance with some embodiments of the present disclosure. As shown in FIG. 9, the page 410 may be configured to store a data D41 and the page 411 may be configured to store a data D42. An address ADD1 of the page 410 (e.g., a first area) is different from an address ADD2 of the page 411 (e.g., a second area). The data D41 and the data D42 may be associated with the original DO. The data D41 may be associated with the data D42. The data D41 may be encoded to be the data D42. The data D42 may be complementary with the data D41. As illustrated in FIGS. 5 and 6, the data storage device 100 can read the correct data from the data-pair of the normal data D41 and the encoded data D42.

Figure 10:
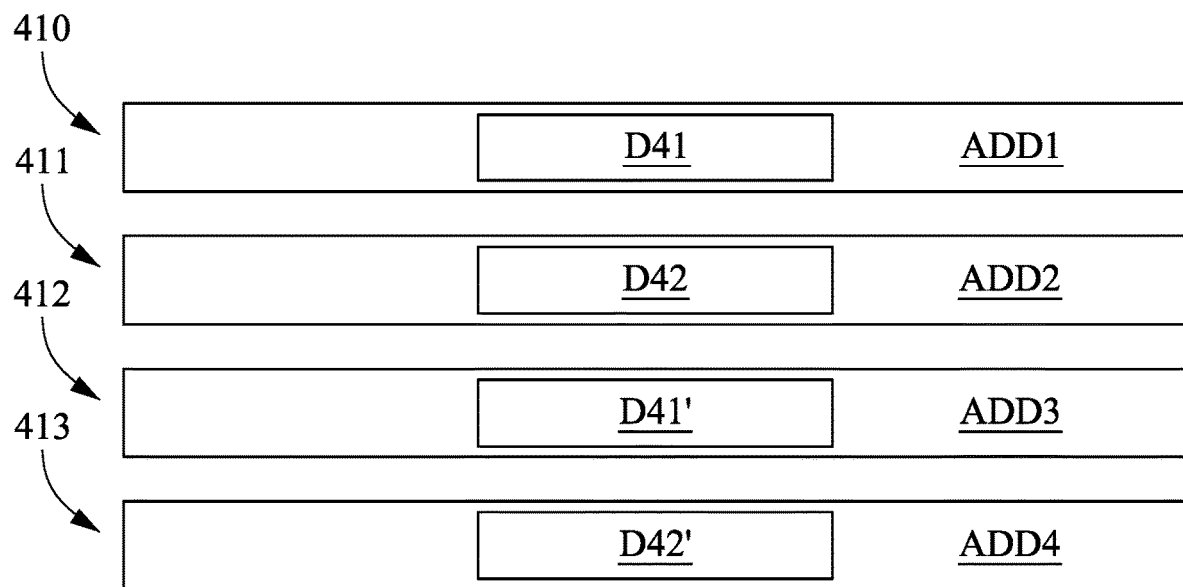
FIG. 10 illustrates a block diagram of a plurality of pages of a memory module of a data storage device in accordance with some embodiments of the present disclosure.

FIG. 10 illustrates a block diagram of the plurality of pages 410, 411, 412, and 414 of the memory module 2 of the data storage device 100 in accordance with some embodiments of the present disclosure. The detailed descriptions of the pages 410 and 411 can refer to the embodiments as illustrated in FIG. 9.

As shown in FIG. 10, the page 412 may be configured to store a data D41' and the page 413 may be configured to store a data D42'. An address ADD3 of the page 412 (e.g., a third area) is different from an address ADD4 of the page 413 (e.g., a fourth area). The data D41' and the data D42' may be associated with the original DO. The data D41' may be associated with the data D42'. The data D41' may be encoded to be the data D42'. The data D42' may be complementary with the data D41'. The data storage device 100 can read the correct data from the data-pair of the normal data D41 and the encoded data D42 and the data-pair of the normal data D41' and the encoded data D42' through the operations as illustrated in FIGS. 5 and 6.

Figure 11:
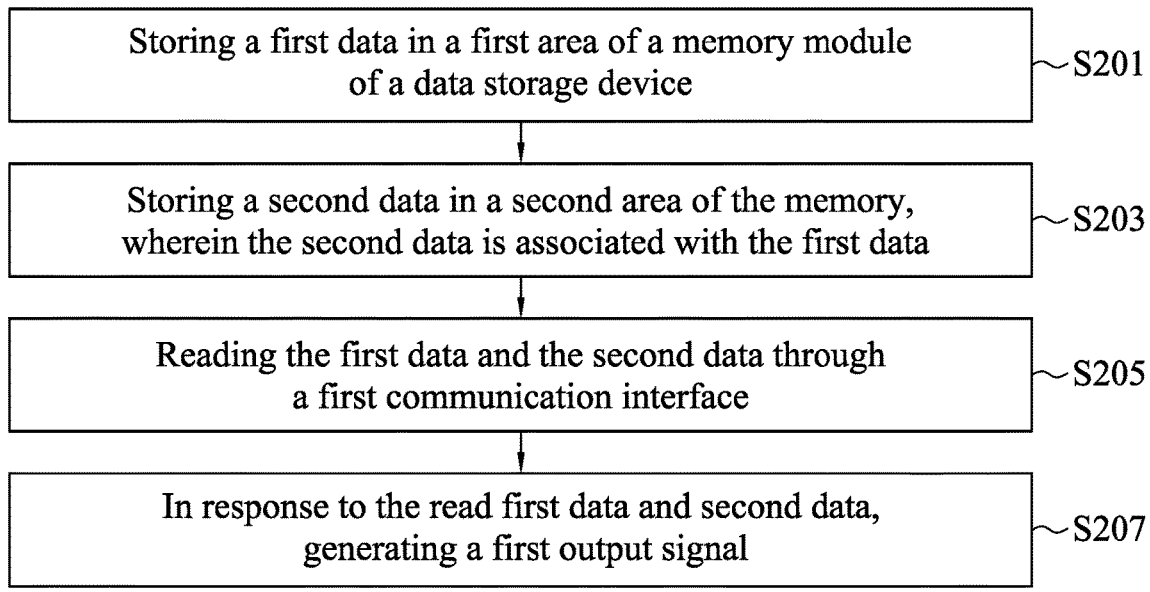
FIG. 11 is a flowchart of a method of controlling a data storage device, in accordance with some embodiments of the present disclosure.

FIG. 11 is a flowchart of a method 200 of controlling a data storage device (e.g., the data storage device 100), in accordance with some embodiments of the present disclosure.

The method 200 begins with operation S201 comprising storing a first data in a first area of a memory module of the data storage device.

The method 200 continues with operation S203 comprising storing a second data in a second area of the memory module. The second data is associated with the first data.

The method 200 continues with operation S205 comprising reading the first data and the second data through a first communication interface.

The method 200 continues with operation S207 comprising, in response to the read first data and second data, generating a first output signal.

The method 200 continues with operation S209 comprising forming a connection layer on a dielectric layer of the data processing device.

The method 200 is merely an example, and is not intended to limit the present disclosure beyond what is explicitly recited in the claims. Additional operations can be provided before, during, or after each operation of the method 200, and some operations described can be replaced, eliminated, or moved around for additional embodiments of the method. In some embodiments, the method 200 can include further operations not depicted in FIG. 11. In some embodiments, the method 200 can include one or more operations depicted in FIG. 11.

Figure 12:
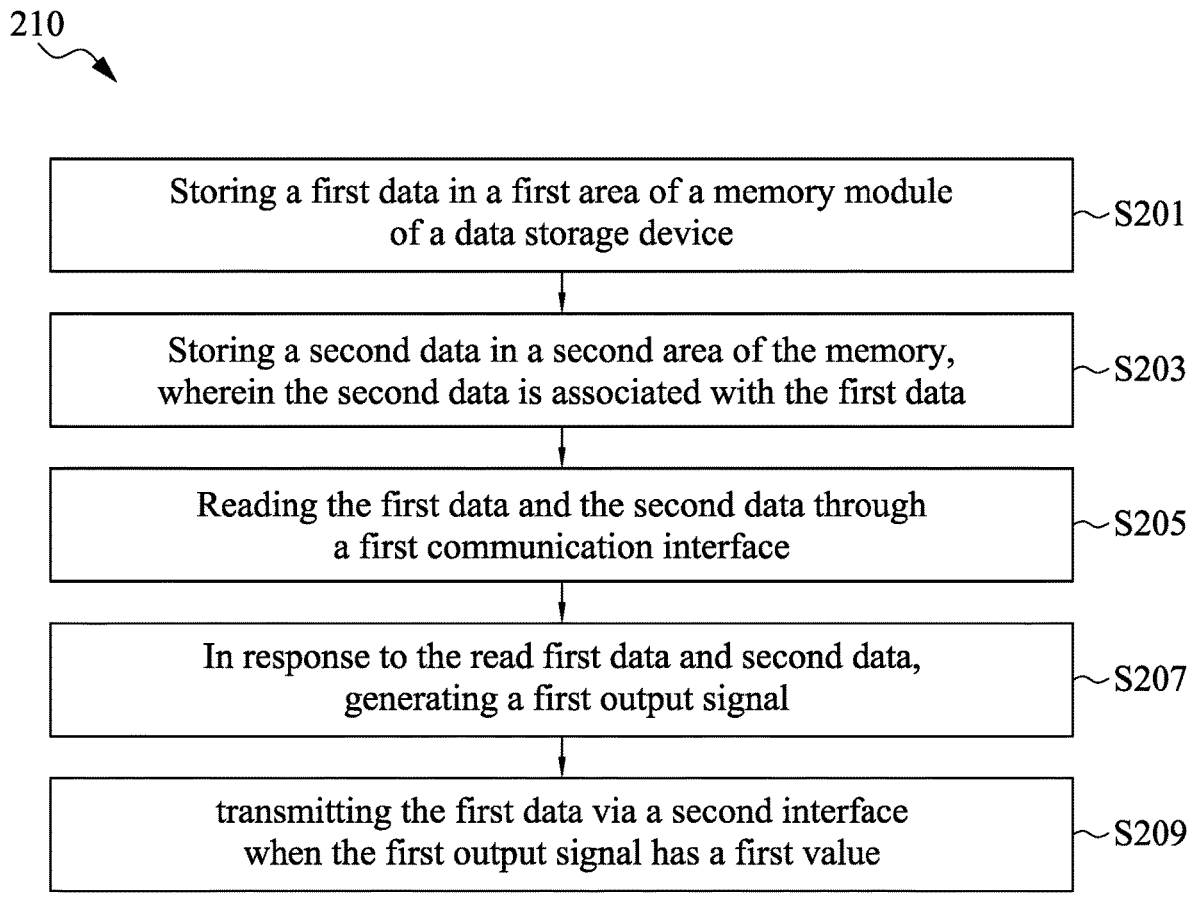
FIG. 12 is a flowchart of a method of controlling a data storage device, in accordance with some embodiments of the present disclosure.

FIG. 12 is a flowchart of a method 210 of controlling a data storage device (e.g., the data storage device 100), in accordance with some embodiments of the present disclosure. The method 210 of FIG. 12 is similar to the method 200 of FIG. 11, and the difference therebetween is described below.

The method 210 further includes operation S209. The operation S209 comprises transmitting the first data through a second communication interface when the first output signal has a first value.

The method 210 is merely an example, and is not intended to limit the present disclosure beyond what is explicitly recited in the claims. Additional operations can be provided before, during, or after each operation of the method 210, and some operations described can be replaced, eliminated, or moved around for additional embodiments of the method. In some embodiments, the method 210 can include further operations not depicted in FIG. 12. In some embodiments, the method 210 can include one or more operations depicted in FIG. 12.

Figure 13:
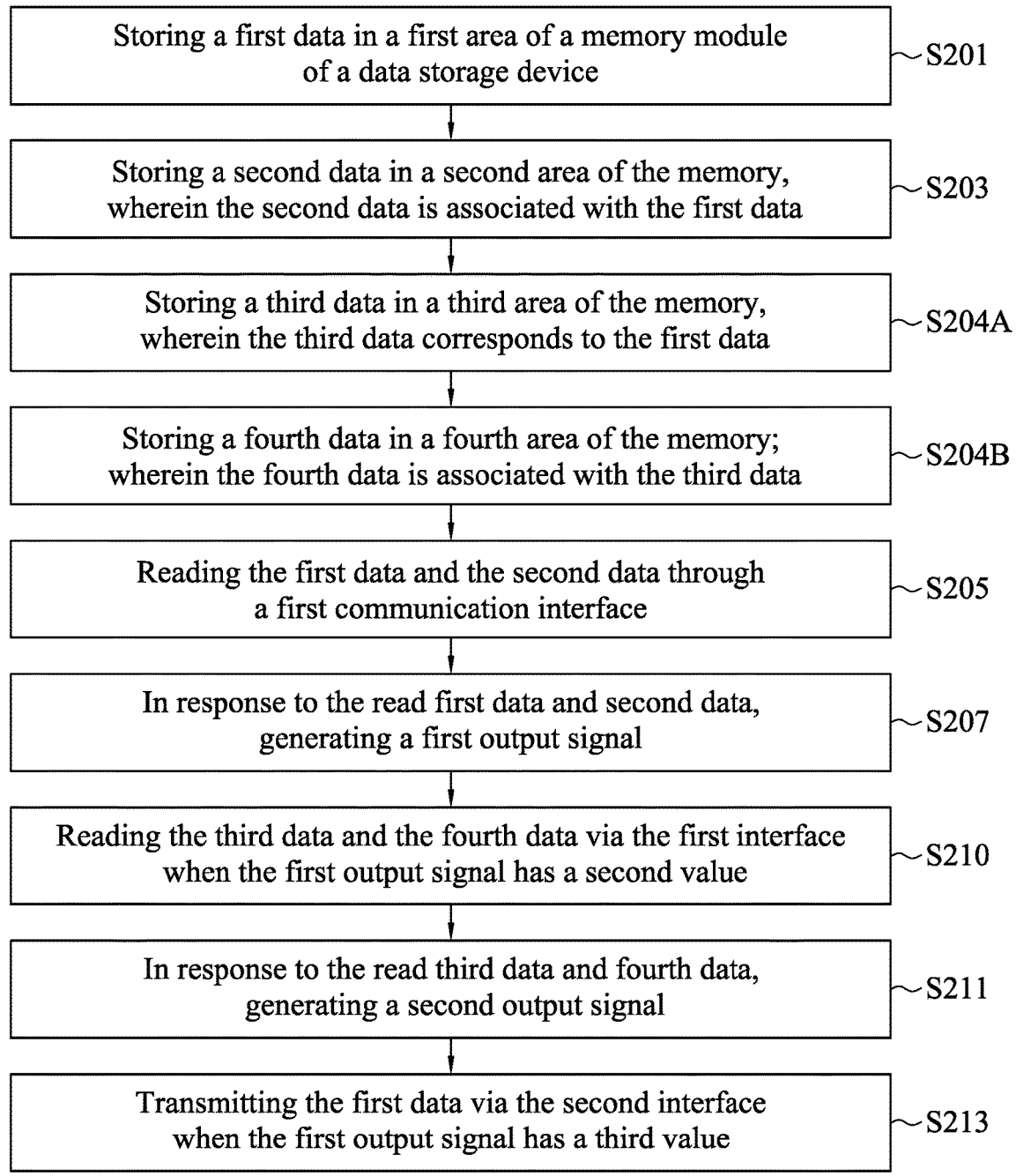
FIG. 13 is a flowchart of a method of controlling a data storage device, in accordance with some embodiments of the present disclosure.

FIG. 13 is a flowchart of a method 220 of controlling a data storage device (e.g., the data storage device 100), in accordance with some embodiments of the present disclosure. The method 220 of FIG. 13 is similar to the method 200 of FIG. 11, and the difference therebetween is described below.

The method 220 further includes operation S204A. The operation comprises storing a third data in a third area of the memory module, wherein the third data corresponds to the first data.

The method 220 continues with operation S204B comprising storing a fourth data in a fourth area of the memory module. The fourth data is associated with the third data.

The method 220 further includes operation S210. The operation S210 comprises reading the third data and the fourth data through the first communication interface when the first output signal has a second value.

The method 220 continues with operation S211 comprising, in response to the read third data and fourth data, generating a second output signal.

The method 220 continues with operation S213 comprising transmitting the third data through the second communication interface when the second output signal has a third value.

The method 220 is merely an example, and is not intended to limit the present disclosure beyond what is explicitly recited in the claims. Additional operations can be provided before, during, or after each operation of the method 220, and some operations described can be replaced, eliminated, or moved around for additional embodiments of the method. In some embodiments, the method 220 can include further operations not depicted in FIG. 13. In some embodiments, the method 220 can include one or more operations depicted in FIG. 13.

Figure 14:
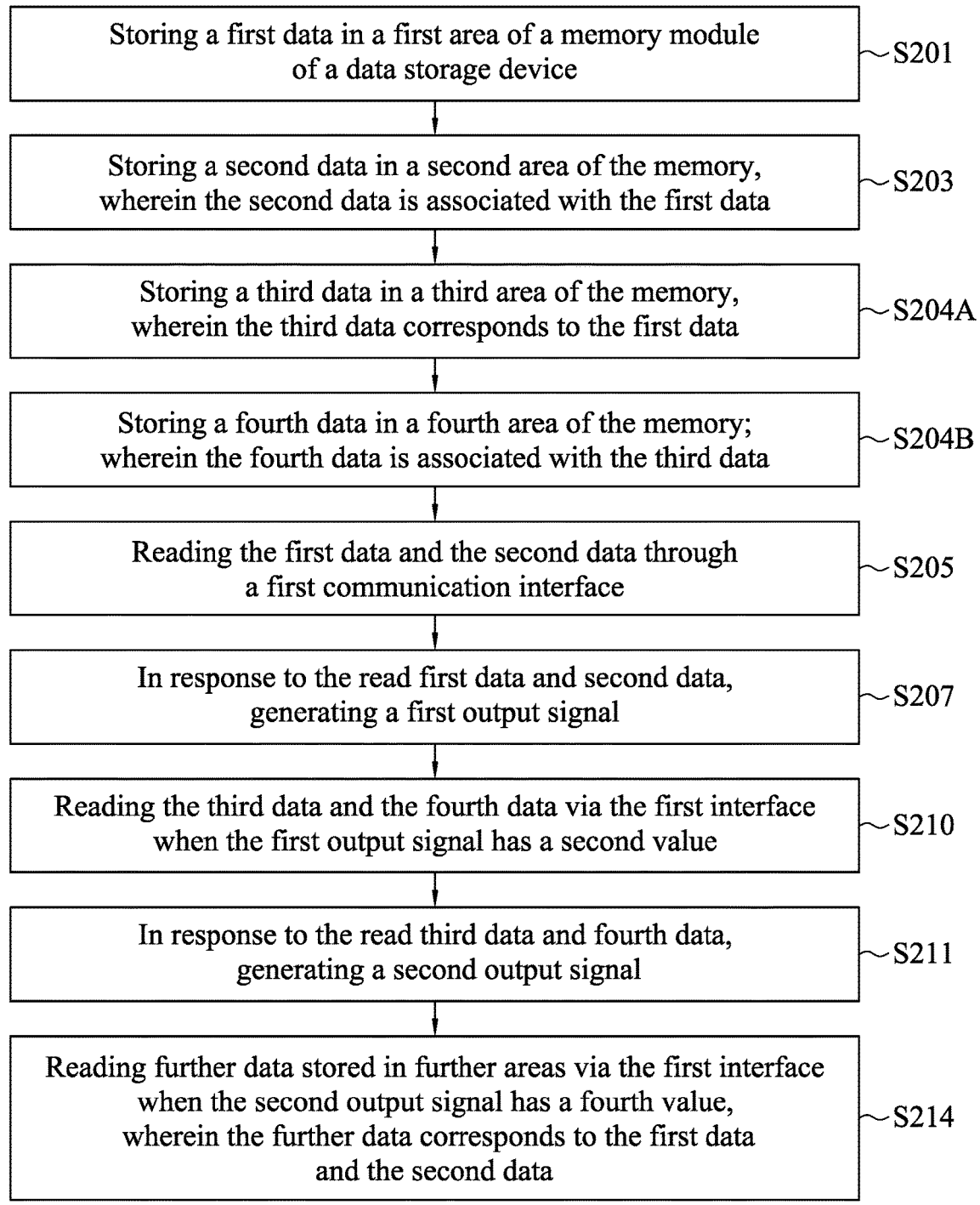
FIG. 14 is a flowchart of a method of controlling a data storage device, in accordance with some embodiments of the present disclosure.

FIG. 14 is a flowchart of a method 230 of controlling a data storage device (e.g., the data storage device 100), in accordance with some embodiments of the present disclosure. The method 230 of FIG. 14 is similar to the method 220 of FIG. 13, and the difference therebetween is described below.

Instead of operation S213, the method 230 continues with operation S214, reading further data stored in further areas through the first communication interface when the second output signal has a fourth value. The further data corresponds to the first data and the second data.

The method 230 is merely an example, and is not intended to limit the present disclosure beyond what is explicitly recited in the claims. Additional operations can be provided before, during, or after each operation of the method 230, and some operations described can be replaced, eliminated, or moved around for additional embodiments of the method. In some embodiments, the method 230 can include further operations not depicted in FIG. 14. In some embodiments, the method 230 can include one or more operations depicted in FIG. 14.

One aspect of the present disclosure provides a method of controlling a data storage device, comprising: storing a first data in a first area of a memory of the data storage device; storing a second data in a second area of the memory, wherein the second data is associated with the first data; reading the first data and the second data via a first communication interface; and in response to the read first data and second data, generating a first output signal.

Another aspect of the present disclosure provides a data storage device. The data storage device includes a first area and a second area. The first area is configured to store a first data. The second area is configured to store a second data. The second data is associated with the first data. The first data and/or the second data exclude an ECC.

Another aspect of the present disclosure provides a non-transitory computer readable medium storing a program including instructions that, when executed by a processor, cause a data storage device to: store a first data in a first area of the memory; store a second data in a second area of the memory, wherein the second data is associated with the first data; read the first data and the second data via a first communication interface; and in response to the read first data and second data, generate a first output signal.

The data storage device of the present disclosure includes a memory controller and a memory module. The memory module includes a first area and a second area. The first area and the second area are configured to store a first data and a second data, respectively. The first data is associated with the second data to form a data pair. The first data may be normal data and the second data may be encoded data. The memory controller is configured to read the first data and the second data via a communication interface and then generate an output signal based on the read first data and the second data. Generating the output signal includes performing a logic operation on the first data and the second data. When the output signal has a first value, it indicates that the first data and the second data are free from data corruption. When the output signal has a second value, it indicates that one of the first data and the second data has data corruption in its bit(s). Such a determination of the value of the output signal can be repeated on other data pairs. The data storage device of the present disclosure can detect whether the data pair is correct without using error correction code (ECC). It is beneficial for the memory controller which has a passive ECC function, i.e., the ECC function is enabled after receiving data. Such a memory controller can still directly read the correct data from the memory module. The risk of incorrectly triggering the ECC function of the memory controller with incorrect data can be diminished.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for controlling a data storage device comprising:
   storing a first data in a first area of a memory module of the data storage device;
   storing a second data in a second area of the memory module,
   wherein the second data is associated with the first data and the first data and/or the second data exclude an error correction code;
   reading the first data and the second data through a first communication interface; and
   in response to the read first data and second data, generating a first output signal, wherein generating the first output signal includes performing a logic operation based on the first data and the second data.

2. The method of claim 1, wherein the first area and the second area are on the same page of the memory module.

3. The method of claim 2, wherein the first area includes a first plurality of sub-areas and the second area includes a second plurality of sub-areas.

4. The method of claim 3, wherein the first plurality of sub-areas and the second plurality of sub-areas are interleaved with each other.

5. The method of claim 1, wherein the first area is on a first page of the memory module and the second area is on a second page of the memory module.

6. The method of claim 5, wherein the first page and the second page are located next to each other.

7. The method of claim 1, wherein an address of the first area is different from that of the second area.

8. The method of claim 1, wherein the second data and the first data are the same.

9. The method of claim 1, wherein storing the second data in the second area of the memory module includes encoding the first data into the second data.

10. The method of claim 9, wherein the second data is complementary to the first data.

11. The method of claim 1, wherein the logic operation includes at least one of AND, NAND, OR, NOR, NOT, XOR, and XNOR.

12. The method of claim 1, wherein the first data and/or the second data is not processed by an ECC function of a memory controller.

13. The method of claim 1, further comprising: transmitting the first data through a second communication interface when the first output signal has a first value.

14. The method of claim 13, further comprising:
storing a third data in a third area of the memory module, wherein the third data corresponds to the first data; and
storing a fourth data in a fourth area of the memory module, wherein the fourth data is associated with the third data.

15. The method of claim 14, further comprising:
reading the third data and the fourth data through the first communication interface when the first output signal has a second value.

16. The method of claim 15, wherein the first value and the second value are different.

17. The method of claim 15, further comprising:
in response to the read third data and fourth data, generating a second output signal.

18. The method of claim 17, further comprising: transmitting the third data through the second communication interface when the second output signal has a third value; and reading further data stored in further areas through the first communication interface when the second output signal has a fourth value, wherein the further data corresponds to the first data and the second data.

19. The method of claim 14, wherein storing the fourth data in the fourth area of the memory module includes encoding the third data into the fourth data, and the fourth data is complementary to the third data.

\* \* \* \* \*